United States Patent [19]

Nakao et al.

[11] Patent Number: 5,743,005
[45] Date of Patent: Apr. 28, 1998

[54] COMPONENT MOUNTING APPARATUS AND METHOD

[75] Inventors: Osamu Nakao, Moriguchi; Masanori Yasutake, Hirakata; Wataru Hirai, Osaka; Makoto Kawai, Neyagawa, all of Japan

[73] Assignee: Matsushita Electric Industrial Co, Ltd., Kadoma, Japan

[21] Appl. No.: 700,755

[22] Filed: Aug. 9, 1996

Related U.S. Application Data

[63] Continuation of Ser. No. 266,659, Jun. 28, 1994, abandoned.

Foreign Application Priority Data

Jun. 28, 1993 [JP] Japan .................. 5-155947

[51] Int. Cl.⁶ .................. H05K 3/30; H05K 13/02; H05K 13/04; H05K 13/08
[52] U.S. Cl. .................. 29/833; 29/712; 29/721; 29/740; 29/743; 294/64.1; 356/375; 356/376; 364/468.28; 382/145; 414/730; 414/752; 901/47
[58] Field of Search .................. 29/703, 712, 721, 29/740, 741, 743, 832, 833, 834, 836; 294/64.1; 356/375, 376; 364/468.28; 382/145; 414/730, 737, 752; 901/40, 46, 47

[56] References Cited

U.S. PATENT DOCUMENTS

| | | | |
|---|---|---|---|
| 4,598,456 | 7/1986 | McConnell | 29/721 X |
| 4,608,494 | 8/1986 | Kobayashi et al. | 29/721 X |
| 4,738,025 | 4/1988 | Arnold | 29/740 X |
| 4,941,256 | 7/1990 | Capson et al. | 29/833 |
| 4,951,383 | 8/1990 | Amao et al. | 356/375 X |
| 5,076,697 | 12/1991 | Takagi et al. | 356/376 |
| 5,323,528 | 6/1994 | Baker | 29/721 |

FOREIGN PATENT DOCUMENTS

| | | | |
|---|---|---|---|
| 4216640 | 8/1992 | Japan | 29/740 |
| 4286195 | 10/1992 | Japan | 29/743 |

OTHER PUBLICATIONS

Multiple size chip pickup, orientation and placement station, IBM Technical Disclosure Bulletin, vol. 22, No. 7, Dec. 1979, pp. 2757–2761.

*Primary Examiner*—Peter Vo
*Attorney, Agent, or Firm*—Wenderoth, Lind & Ponack

[57] ABSTRACT

A component mounting apparatus and method for mounting components on to-be-mounted positions of works, includes a carrying device for continuously and successively carrying the works in a working area, and a first component-mounting device for picking up one component from component supply units in a first component supply section and mounting the picked-up component on the to-be-mounted position of one of the works being continuously and successively carried in the work area.

14 Claims, 9 Drawing Sheets

CONTINUOUS CARRYING

XY ROBOT MOVING PATTERN

COMPONENT MOUNTING APPARATUS AND METHOD

This application is a Continuation of application Ser. No. 08/266,659, filed Jun. 28, 1994 now abandoned.

BACKGROUND OF THE INVENTION

The present invention relates to a component mounting apparatus for sucking and mounting electronic components on circuit boards.

An example of a conventional component mounting apparatus is described below with reference to FIGS. 8 and 9.

FIG. 8 is a perspective view showing principal portions of the conventional component mounting apparatus. The component mounting apparatus comprises a moving table 42 for moving, to a predetermined position, a plurality of component supply units 40 each of which carries a carrier tape (not shown) accommodating electronic components arranged at regular intervals; a sucking nozzle 43 for sucking an electronic component from one of the component supply units 40, thus supplying it to a circuit board 41; a rotary head 44; an X-Y table 45 for setting the circuit board 41 at a predetermined position; a feed-in unit 46 for feeding the circuit board 41 to the X-Y table 45; and a feed-out unit 47 for feeding out the circuit board 41 from the X-Y table 45.

FIG. 9 is a plan concept view showing the operation of the component mounting apparatus shown in FIG. 8. The sucking nozzles 43 installed on the rotary head 44 move along a predetermined path intermittently synchronously with each other, thus sucking a predetermined electronic component from one of the component supply units 40 placed on the moving table 42 when the sucking nozzles 43 is disposed at a suction position (A). The electronic component sucked and held by the sucking nozzles 43 is moved along the path A→B→C→D and is mounted on the circuit board 41 set in position by the X-Y table 45.

A control section (not shown) for detecting whether or not the electronic component sucked by the sucking nozzles 43 is held by the nozzle 43 in a normal posture is provided in a path between the position (B) and the position (C). If the control section has decided that the electronic component is not held by the nozzle 43 in the normal posture, the component is not mounted on the circuit board 41 but discharged to a discharge box 48 provided at the position (D) owing to the change of the internal pressure of the nozzle of the sucking nozzle 43 from a negative pressure to a positive pressure.

In feeding the circuit board 41 to the X-Y table 45 and feeding it out therefrom, the X-Y table 45 is moved to a board feeding position 49 so that one circuit board 41 is fed thereto and the other circuit board 41 is fed out therefrom by a board feeding lever 50.

The conventional apparatus having the above-described construction has, however, a disadvantage that it takes long to feed the electronic component, because the X-Y table 45 moves to the board feeding position 49 after the electronic component is mounted on the circuit board 41 and then the circuit board 41 is fed to the X-Y table 45 and fed out therefrom by the board feeding lever 50.

Further, this construction has another disadvantage that large noise is generated when the sucking nozzles 43 rotate at high speed and when the moving table 42 carrying the component supply units 40 moves so that the sucking nozzles 43 suck the electronic components.

SUMMARY OF THE INVENTION

It is an object of the present invention to provide a component mounting apparatus capable of feeding a circuit board in a short period of time and mounting it on the circuit board quietly.

In accomplishing these and other objects, according to a first aspect of the present invention, there is provided a component mounting apparatus for mounting components on to-be-mounted positions of works, comprising:
- a carrying device for successively carrying the works in a working area; and
- a first component-mounting device for picking up one component from component supply units in a first component supply section and mounting the picked-up component on the to-be-mounted position of one of the works being successively carried in the work area.

According to a second aspect of the present invention, there is provided a component mounting method for mounting components on to-be-mounted positions of works, comprising steps of:
- successively carrying the works in a working area by a carrying device;
- picking up one component by a first component-mounting device from component supply units in a first component supply section; and
- mounting the picked-up component on the to-be-mounted position of one of the works being successively carried in the work area.

According to a third aspect of the present invention, there is provided a component mounting method for mounting components on to-be-mounted positions of works being successively carried in a work area by a carrying device, comprising steps of:
- picking up one component by a first component-mounting device from component supply units in a first component supply section;
- calculating by a controller a mounting position in the work area where the picked-up component is mounted on the work based on data indicating the to-be-mounted position of the component picked up by the first component-mounting device on the work, a work position of the work being successively carried, and a work-carrying speed of a carrying device, and then calculating an operational moving pattern of the first component-mounting device based on the calculated mounting position in the work area;
- driving the first component-mounting device by the operational moving pattern under control of the controller; and
- mounting the picked-up component on the to-be-mounted position of one of the works at the calculated mounting position by the first component-mounting device under control of the controller.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
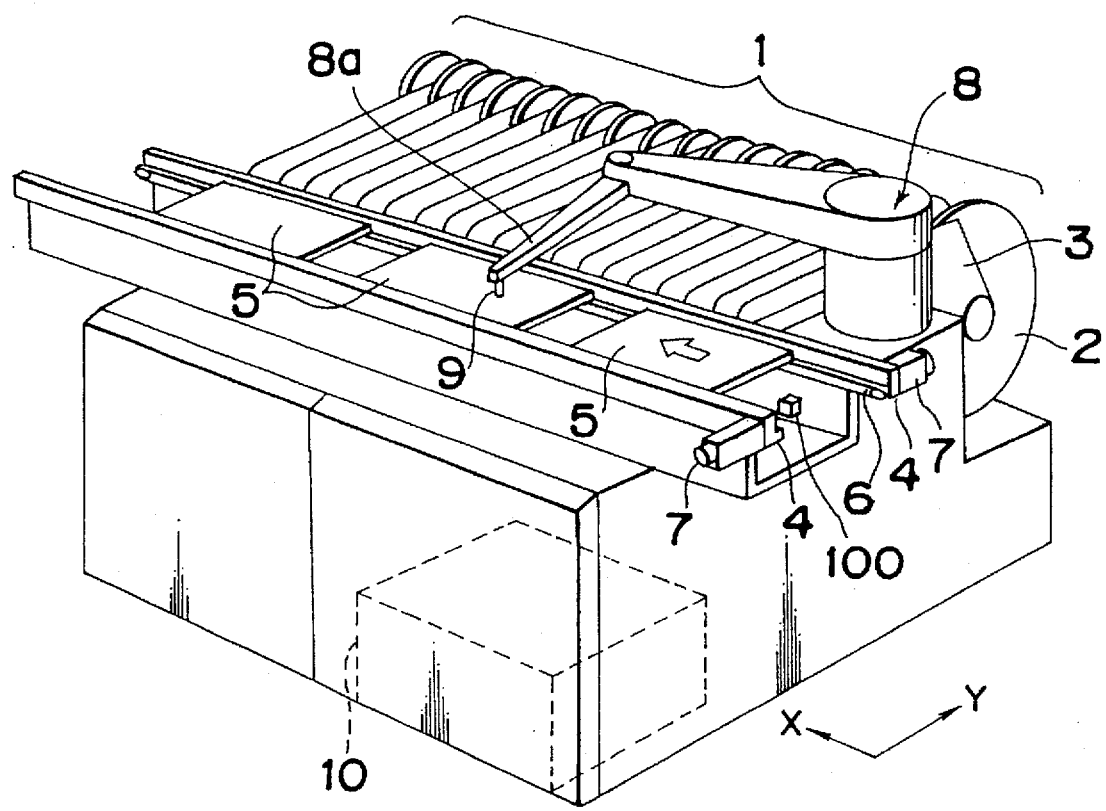
FIG. 1 is a perspective view showing a component mounting apparatus according to a first embodiment of the present invention.

Before the description of the present invention proceeds, it is to be noted that like parts are designated by like reference numerals throughout the accompanying drawings.

A component mounting apparatus according to a first embodiment of the present invention is described below with reference to FIGS. 1 through 3.

FIG. 1 is a perspective view showing the component mounting apparatus according to the first embodiment of the present invention. Referring to FIG. 1, a plurality of component supply units 3 removably holding a plurality of electronic components wound on a reel 2 is disposed in a row in a component supply section 1. A carrier system comprises a pair of board feeding rails 4 extending horizontally in the feeding direction of works such as circuit boards 5, a pair of feeding belts 6 for feeding a plurality of circuit boards 5 at a constant speed successively while the circuit boards 5 are guided by the rails 4, and a pair of servo motors 7 for driving the feeding belts 6. The circuit boards 5 are fed successively along the board feeding rails 4 in a work area by the carrier system.

A component mounting-XY-robot 8 serving as a component mounting means sucks an electronic component from the component supply section 1 at a component sucking unit 9 thereof, thus mounting it on the circuit board 5. At this time, a controller 10 calculates the movement position of the circuit board 5 and controls the robot 8 so that the robot 8 mounts the electronic components 11 on the circuit boards 5 at predetermined positions thereof. The arm 8a of the robot 8 is driven by a biaxial servo motor (not shown) and can be positioned in an XY-plane.

Figure 2:
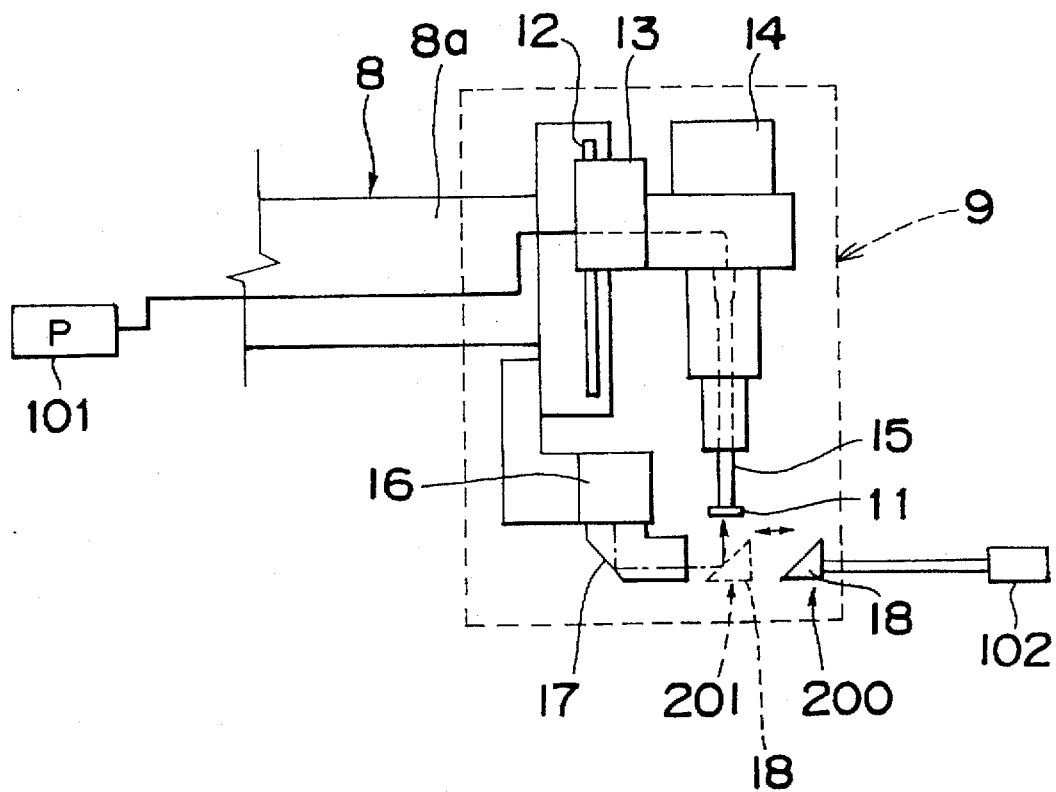
FIG. 2 shows a detailed construction of a component sucking unit of the apparatus in FIG. 1.
Figure 3:
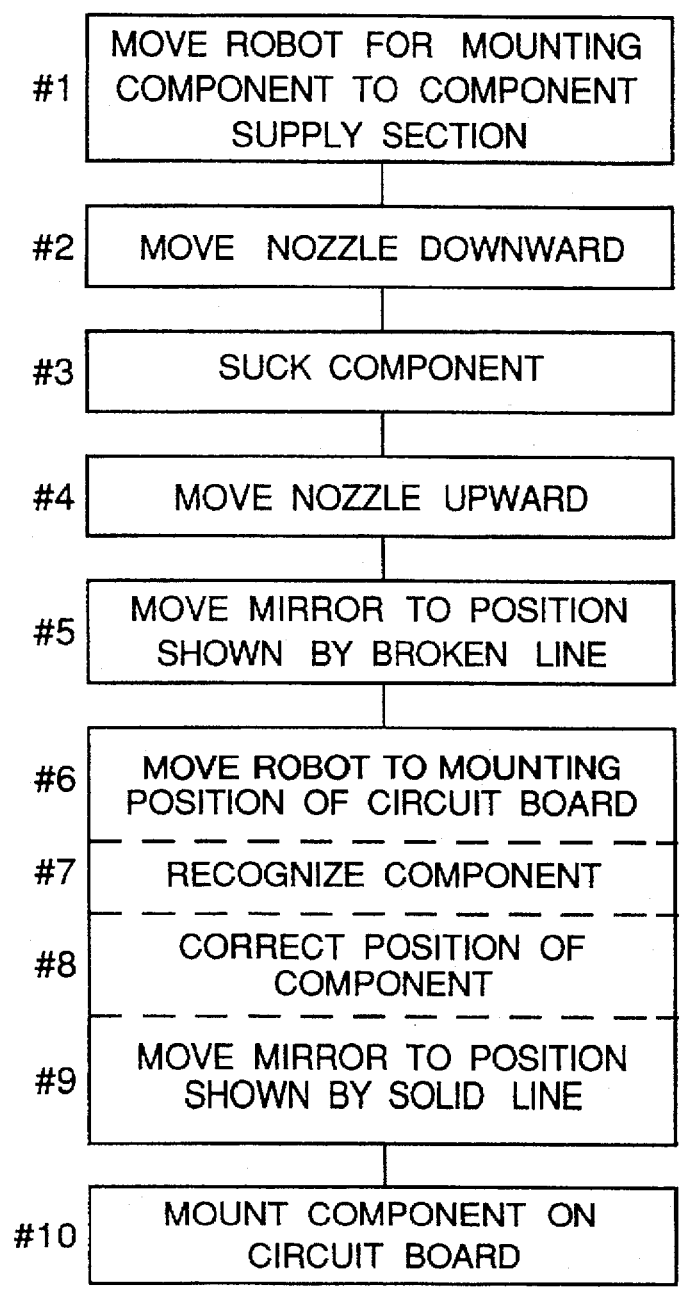
FIG. 3 is a flowchart showing the operation of the component mounting apparatus shown in FIG. 1.

FIG. 2 shows a detailed construction of the component sucking unit 9. FIG. 3 is a flowchart showing the operation flow of the apparatus in sucking the electronic component 11 from the component supply section 1 and mounting it on the circuit board 5. Referring to FIG. 2, the component sucking unit 9 comprises a linear motor 13 which is to be guided by a guide rail 12 vertically disposed on the arm end of the robot 8; a nozzle 15 disposed on the linear motor 13 via a servo motor 14 and connected to a suction pump 101; a CCD camera 16 disposed on the arm end and below the CCD camera 16; a fixed reflection mirror 17 disposed on the arm end and below the CCD camera 16; and a movable reflection mirror 18 which moves toward the reflection mirror 17 or away therefrom by a driving device 102 such as an air cylinder.

Figure 4:
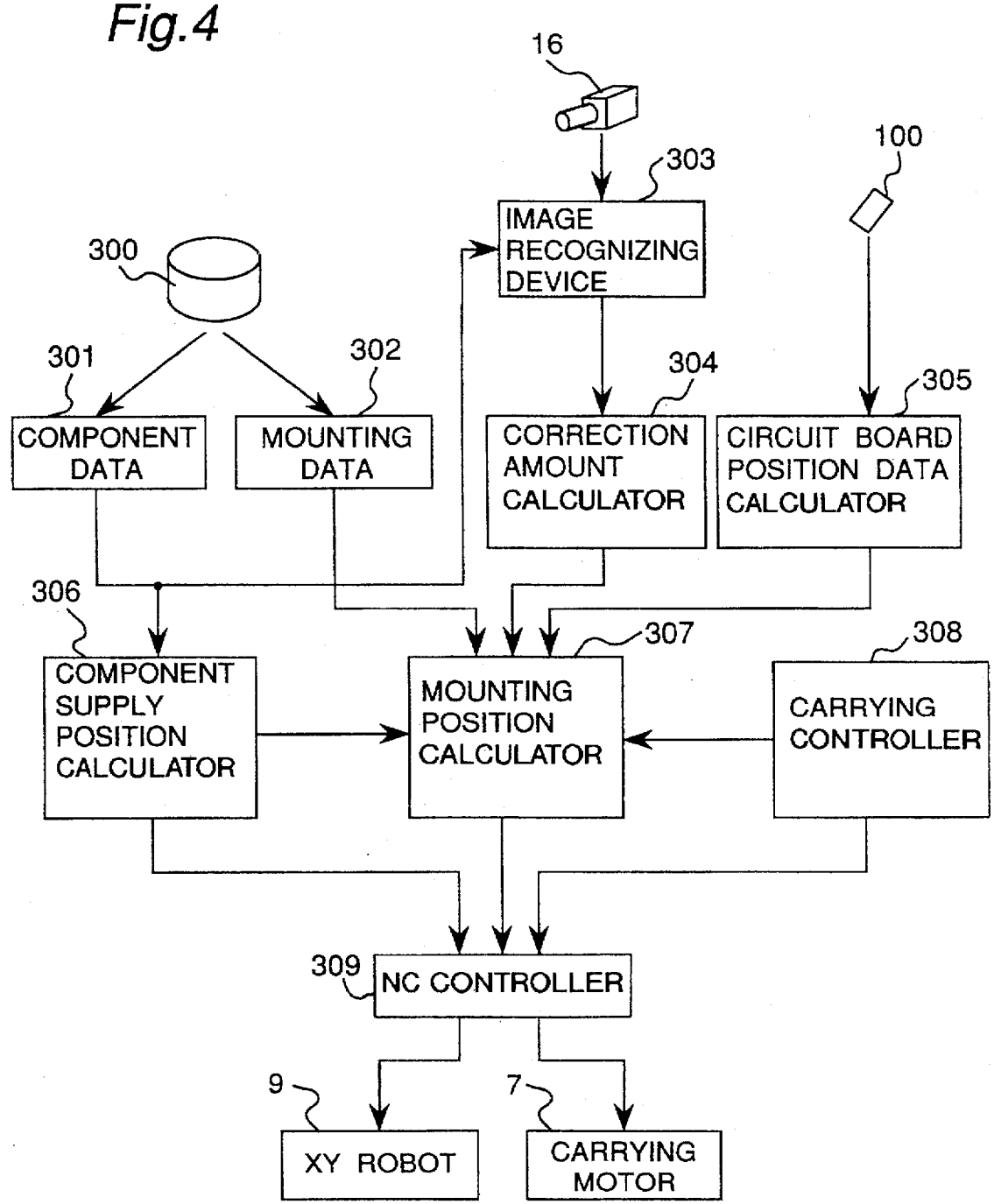
FIG. 4 is a block diagram showing a controller of the apparatus in FIG. 1.

FIG. 4 shows a block diagram showing the controller 10. The controller 10 includes a database 300, an image recognizing device 303, a correction amount calculating part 304, a circuit board position data calculating part 305, a component supply position calculator 306, a mounting position calculator 307, and an NC device 306.

The database 300 has data indicating kinds and mounting positions of the electronic components 11 to be mounted on the circuit boards 5, component positions in the component supply section 1, and the like, and outputs them as a component data 301 and a mounting data 302. The component data 301 is outputted from the database 300 and includes positional data for picking up the next component to be mounted from the component supply section 1, and master data for comparing with input data picked up by the CCD camera 16. The mounting data 302 is also outputted from the database 300 and includes positional data for mounting the components 11 on the circuit boards 5, data of mounting directions of the components 11, and the like.

The image recognizing device 303 receives the master data of the component data 301 from the database 300 and compares the master data with input data of the recognized component 11 picked up by the CCD camera 16.

The correction amount calculator 304 receives data from the image recognizing device 303 which indicates the result of the comparison between the master data and the input data in the image recognizing device 303. Then, the correction amount calculator 304 calculates a shift amount caused when the component 11 is sucked by the nozzle 15 and found based on the result of the comparison between the master data and the input data in the image recognizing device 303, and then outputs data including the shift amount as a correction amount.

The circuit board position data calculator 305 receives data outputted from the sensor 100 and detects the positions of the successively-supplied circuit boards at a time based on the received data.

The component supply position calculator 306 receives the component data 301 from the database 300 to decide a position of a component 11 to be supplied by the XY-robot 8 at the next time and calculate the operational pattern of the robot 8.

The mounting position calculator 307 receives the mounting data 302 from the database 300 and data from the correction amount calculator 304, the circuit board position data calculator 305, the component supply position calculator 306, and a carrying controller 308 for controlling the carrying of the circuit boards 5 as a result of the speed control of the servo motors 7, and calculates the operational movement amount of the robot 8 for moving the component 11 sucked at the component sucking unit 9 of the robot 8 to the mounting position of the component 11, based on the operational moving pattern of the robot 8 outputted from the component supply position calculator 306, the correction amount outputted from the mounting position calculator 307, and the carrying data outputted from the carrying controller 308. Then, the mounting position calculating part 307 outputs signals indicating the operational moving pattern of the robot 8 to the NC controller 309.

The NC controller 306 receives data outputted from the component supply position calculator 306, the mounting position calculator 307, and the carrying controller 308, and outputs signals to the XY-robot 8 and the servo motors 7 so as to drive the XY-robot 8 and the servo motors 7 under the NC control based on respective operational moving pattern.

The operation of the robot 8 having the component sucking unit 9 is performed as follows: Initially, the component data 301 is inputted from the database 300 into the component supply position calculator 306 and based on the inputted data, the robot 8 moves to the component supply section 1 to suck the electronic component 11 therefrom (step #1) in FIG. 3.

Then, the linear motor 13 moves downward along the guide rail 12, thus causing the nozzle 15 to move downward (step #2) and suck the electronic component 11 from the component supply section 1 (step #3).

Then, the linear motor 13 moves upward, thus causing the nozzle 15 to move upward (step #4) and the movable reflection mirror 18 to move toward a position 201 shown by a broken line by the driving device 102 (step #5). At this time, the robot 8 starts to move so that the robot 8 mounts the component 11 on a predetermined position of the circuit board 5 (step #6). That is, firstly, the robot 8 sucks the electronic component 11 to be mounted.

During the movement of the robot 8, an image of the electronic component 11 sucked by the component sucking unit 9 of the robot 8 is reflected by the movable reflection mirror 18 and the fixed reflection mirror 17 to input in the CCD camera 16 and thus the component 11 is recognized. Based on the information of the component 11 obtained by the CCD camera 16, the controller 10 detects whether or not the nozzle 15 has sucked and held the electronic component 11 in a normal position (step #7). That is, in the image recognizing device 303 of the controller 10, the recognized image data as input data is compared with the master data of the component data 301 from the database 300 and data is outputted to the correction amount calculator 304 which indicates the result of the comparison between the master data and the image data of the component 11. That is, the outputted data indicates whether or not the center of the component 11 is shifted from the center of the nozzle 15.

Based on the recognized result, the wrong position of the arm 8a of the robot 8 in the rotational direction is corrected by the servo motor 14 while the wrong position of the robot arm 8a in the horizontal direction (XY-direction) is corrected by correcting the set position of the robot 8 (step #8). That is, the correction amount calculator 304 calculates, as a correction amount of the position of the electronic component 11 in the X, Y, and θ directions, a shift amount caused when the component 11 is sucked by the nozzle 15 and found based on the result of the comparison between the master data and the input data in the image recognizing device 303, and then outputs signals indicating the correction amount to the mounting position calculator 307.

Then, the mounting position calculator 307 calculates the operational movement amount of the robot 8 based on the inputted data of the component supply position calculating part 306, the correction amount caused in the suction of the component 11, and the carrying amount of the circuit boards 5. The operational movement amount includes the mounting position of the circuit board 5 for mounting at the position the component 11 sucked and held by the robot 8 with the circuit board 5 successively carried. Based on the instruction outputted from the mounting position calculator 307 to the NC controller 309 and including the operational movement amount of the robot 8, the robot 8 is driven with the servo motors 7 driven at a constant speed based on the control of the carrying control part 308. At that time, the movable reflection mirror 18 is moved to a position 200 shown by a solid line by the driving device 102 so as not to prevent the component mounting operation of the robot 8 (step #9).

When the robot 8 has arrived at the predetermined position of the circuit board 5, the linear motor 13 moves downward, thus causing the nozzle 15 to move downward and mount the electronic component 11 on the predetermined position of the circuit board 5 (step #10).

An example of a method is described for finding the coordinate of a point where the sucked component 11 is mounted on the circuit board 5 by the robot 8 after the component 11 is sucked by the nozzle 15 of the robot 8 with the to-be-mounted circuit board 5 is successively carried.

Figure 5:
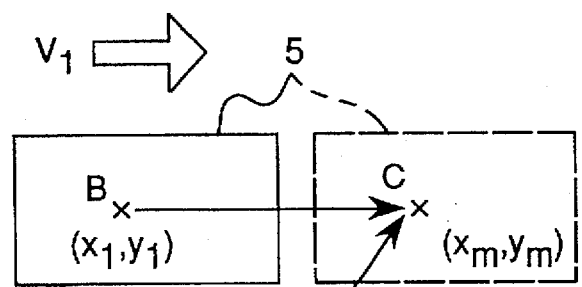
FIG. 5 is a diagram showing a method for finding a coordinate of a point where a sucked component is mounted on a circuit board after the component is sucked with the to-be-mounted circuit board is successively carried.
Figure 5:

As shown in FIG. 5, supposing that $(x_o, y_o)$ is the coordinate of a point (A) where the component 11 is sucked by the nozzle 15 of the robot 8 in the component supply section 1 when the circuit board 5 is successively carried in the X-direction, $(x_1, Y_1)$ is the coordinate of a point (B) where the circuit board 5 on which the sucked component 11 is mounted is positioned when the nozzle 15 sucks the component 11, $(x_m, Y_m)$ is the coordinate of a point (C) where when the robot arm 8a of the robot 8 is moved along a straight line with an arrow based on the moving pattern of the robot arm 8a of the robot 8 and then the sucked component 11 is mounted on the circuit board 5 by the robot 8 after the passage of time $t_s$, $v_1$ is a moving speed of the circuit board 5, $a_o$ is an acceleration of the robot 8, and $v_o$ is the maximum speed of the robot 8, the following expressions are satisfied:

$$x_m - x_1 = v_1 t_s$$

$$\sqrt{(x_m - x_0)^2 + (y_m - y_0)^2} = a_0 t_1^2 + v_0 t_2$$

$$Y_m = Y_1$$

Then, the coordinate $(x_m, Y_m)$ of the point (C) for mounting the component 11 on the circuit board 5 can be found based on the above three expressions, as follows, wherein $t_1 + t_2 = t_s$: when the following expression:

$$\sqrt{(x_m - x_0)^2 + (y_m - y_0)^2} \leq \frac{v_0^2}{a_0}$$

is satisfied, $t_2 = 0$; and
when the following expression:

$$\sqrt{(x_m - x_0)^2 + (y_m - y_0)^2} > \frac{v_0^2}{a_0}$$

is satisfied, $t_1 = v_0/a_0$.

As described above, according to the first embodiment, the electronic components 11 are mounted on the circuit boards 5 which are successively fed. Therefore, this construction eliminates the need for feeding the circuit boards 5 to the component-mounting position outside the carrying path of the circuit boards 5 and feeding them out therefrom, thus saving time.

A component mounting apparatus according to a second embodiment of the present invention is described below with reference to FIG. 6.

Figure 6:
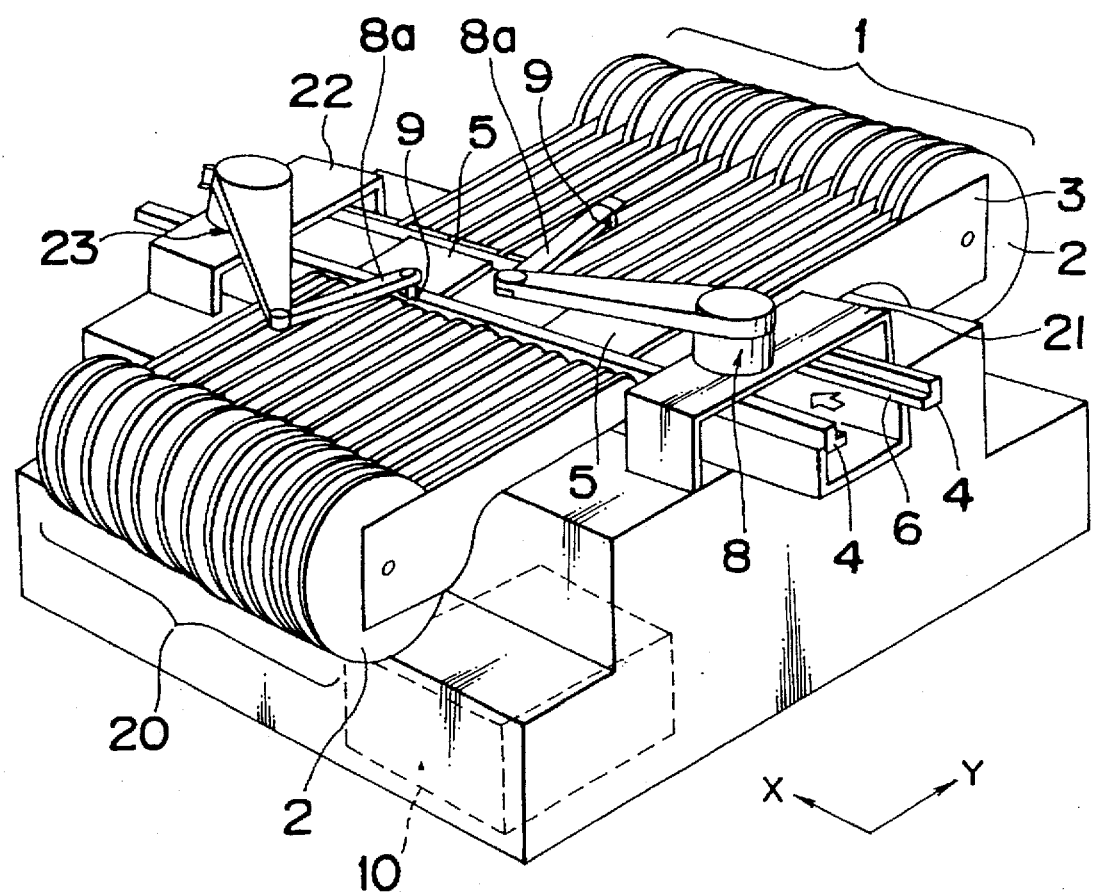
FIG. 6 is a perspective view showing a component mounting apparatus according to a second embodiment of the present invention.

FIG. 6 is a perspective view showing the component mounting apparatus according to the second embodiment of the present invention. Parts shown in FIG. 6 which are the same as the parts of the first embodiment are denoted by the same reference numerals as those parts of the first embodiment.

Referring to FIG. 6, supposing that the circuit board 5 is fed in the carrying direction shown by an arrow of FIG. 6, a robot 8 is provided at the feed-in position of the circuit board 5 via a robot stand 21 and similarly, a robot 23 is provided at the feed-out position thereof via a robot stand 23. Component supply sections 1 and 20 in which a plurality of component supply units 3 is arranged in a row are provided symmetrically with respect to the feeding path of the circuit board 5. The robot 23 and the component supply section 20 respectively have the same construction as the robot 8 and the component supply section 1.

The robots 8 and 23 suck the electronic components 11 from the component supply sections 1 and 20, respectively, thus mounting them on the circuit boards 5, with a time period corresponding to half cycle differentiated from each other. That is, for example, when the robot 8 is sucking one electronic component 11 from the component supply section 1, the robot 23 is mounting the other one on the circuit board 5.

As described above, according to the second embodiment, a plurality of robots 8 and 23 is provided to mount the electronic components 11 on the circuit board 5 being successively fed. Thus, the electronic components 11 can be mounted on the circuit board 5 at a high speed.

A component mounting apparatus according to a third embodiment of the present invention is described below with reference to FIG. 7.

Figure 7:
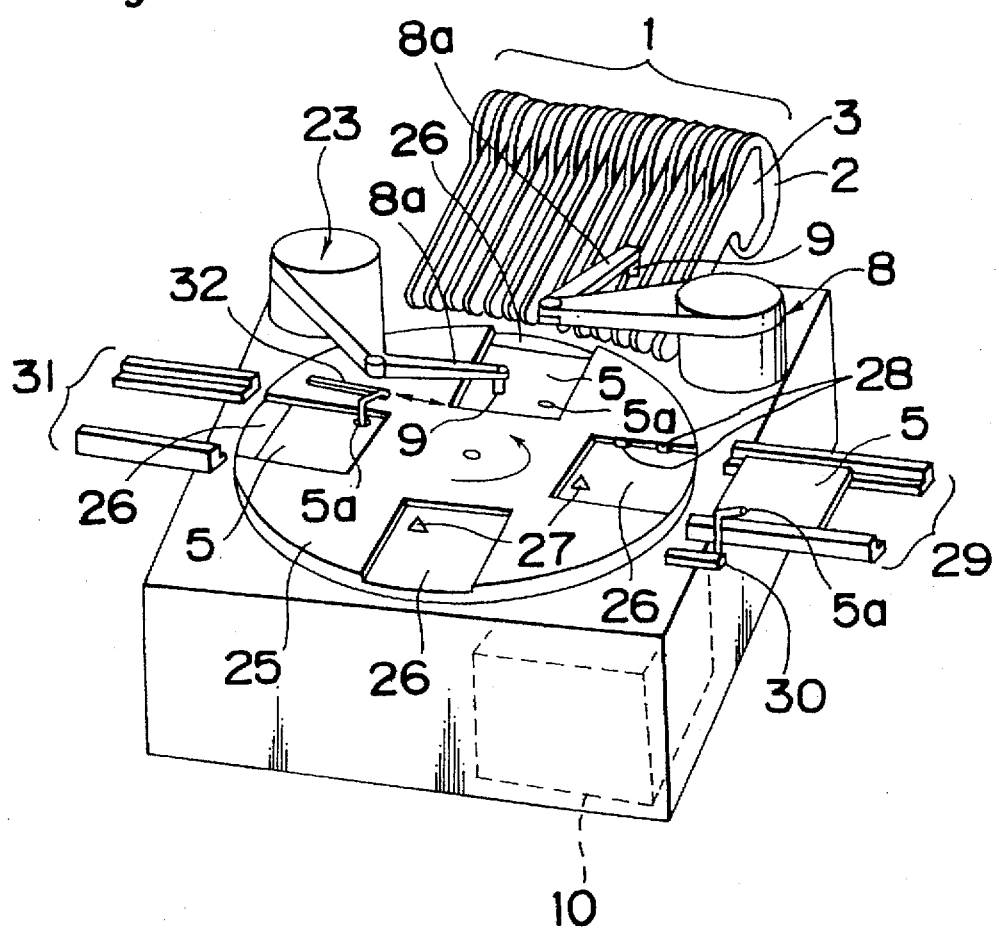
FIG. 7 is a perspective view showing a component mounting apparatus according to a third embodiment of the present invention.
Figure 8:
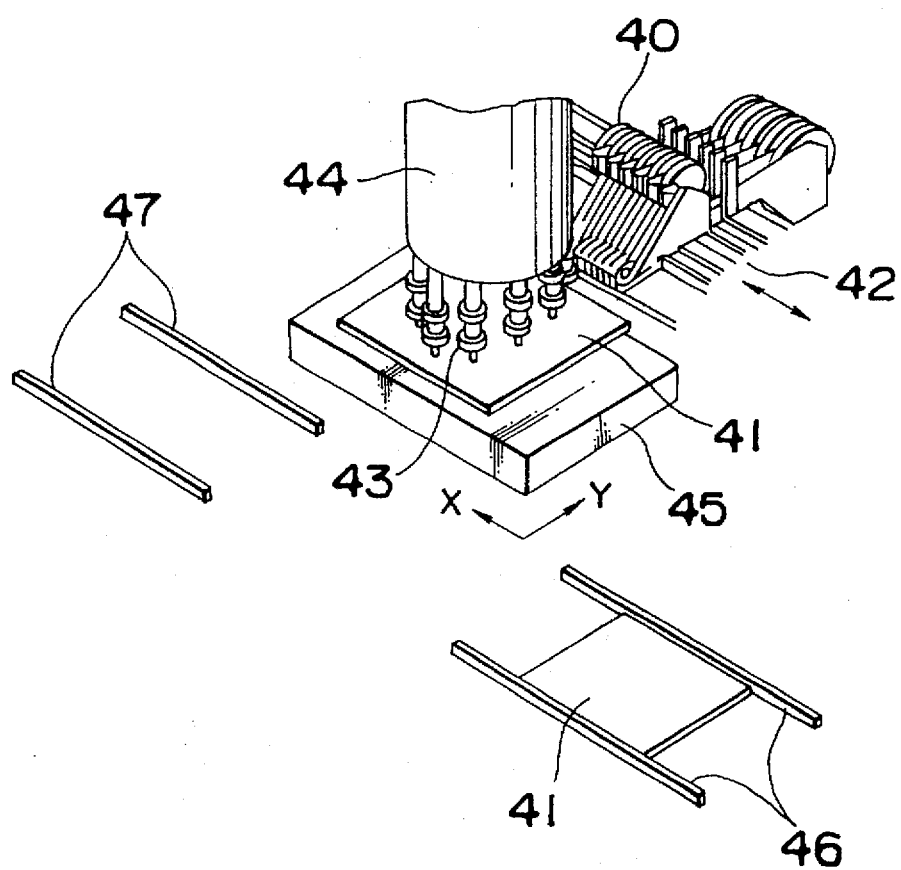
FIG. 8 is a perspective view showing part of a conventional component mounting apparatus.
Figure 9:
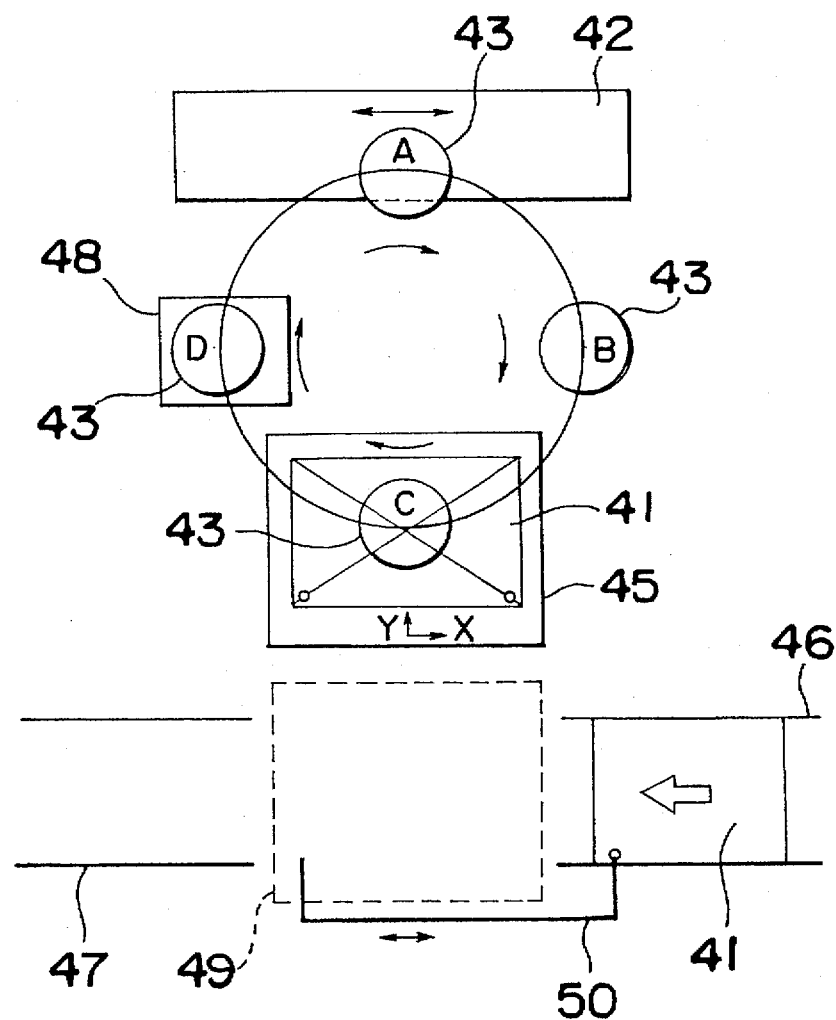
FIG. 9 is a plan concept view showing the operation of the component mounting apparatus shown in FIG. 8.

FIG. 7 is a perspective view showing the component mounting apparatus according to the third embodiment of the present invention. Parts shown in FIG. 7 which are the same as the parts of the first and second embodiments are denoted by the same reference numerals as those of the parts of the first and second embodiment.

In a carrying device for successively feeding the circuit boards 5, a rotary table 25 for rotatably moving the circuit boards 5 in a work area is provided in opposition to the component supply section 1. Four board-regulating positions 26 are provided on the rotary table 25 which is rotating continuously, not intermittently. In order to regulate the position of the circuit board 5, each board-regulating position 26 is provided with a regulating pin 27 movable vertically to regulate a hole 5a of the circuit board 5 horizontally and regulating pins 28 for regulating the position of the circuit board 5 in a direction perpendicular to the radial direction of the rotary table 25.

When a board feed-in conveyor 29 feeds the circuit board 5 to the rotary table 25, a board feed-in lever 30 moves in the feeding direction of the circuit board 5 with the lever 30 inserted into the hole 5a. The circuit board 5 is fed out from the rotary table 25 by a board feed-out conveyor 31 and a board feed-out lever 32 with the lever 32 inserted into the hole 5a. That is, the circuit board 5 is fed to the rotary table 25 by the board feed-in conveyor 29 and fed out therefrom by the board feed-out conveyor 31 after the circuit board 5 makes a one-half rotation on the rotary table 25.

The robots 8 and 23 suck the electronic components 11 from the component supply section 1, thus mounting them on a predetermined position of the circuit board 5 being rotated at a constant speed by the rotary table 25.

As described above, according to the third embodiment, a plurality of robots 8 and 23 is provided to mount the electronic components 11 on the circuit board 5 being successively fed. Thus, the electronic components 11 can be mounted on the circuit board 5 at a high speed.

As described above, according to the first embodiment, the electronic components are mounted on the circuit boards being successively fed. Therefore, this construction eliminates the need for feeding the circuit boards to the component-mounting position outside the carrying path of the circuit boards and feeding them out therefrom, thus saving time. Hence, a high productivity can be obtained. Further, since the component supply section is fixed, little noise is generated.

According to the second embodiment, a plurality of component mounting means is provided to mount the electronic components on the circuit boards being successively fed. Thus, the electronic components can be mounted on the circuit board at a high speed. Thus, a high operation efficiency can be obtained.

According to the third embodiment, the rotary table is provided in addition to a plurality of component mounting means in mounting the electronic components on the circuit boards being successively fed. Thus, the electronic components can be mounted on the circuit board at a higher speed. Thus, a higher operation efficiency can be obtained.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A component mounting apparatus for mounting components on to-be-mounted positions of works, comprising:

a carrying device for continuously and successively transporting the works into a work area; and a first component-mounting device for picking up one component from component supply units in a first component supply section and mounting the picked-up component on the to-be-mounted position of one of the works while said one of the works being successively transported in the work area, wherein motion of the works being successively transported in the work area by said carrying device is continuous.

2. The component mounting apparatus as claimed in claim 1, further comprising a controller for calculating a mounting position in the work area where the picked-up component is mounted on the work based on data indicating the to-be-mounted position of the component picked up by the first component-mounting device on the work, a work position of the work being successively carried, and a work-carrying speed of the carrying device, and calculating an operational moving pattern of the first component-mounting device based on the calculated mounting position in the work area, whereby the first component-mounting device is driven in accordance with the operational moving pattern under control of the controller, and then the picked-up component is mounted on the work at the calculated mounting position by the first component-mounting device.

3. The component mounting apparatus as claimed in claim 2, further comprising a sensor for detecting the work being successively carried; and a carrying controller for controlling the work-carrying speed of the works, wherein the controller comprises:

a database having the data indicating the to-be-mounted position of the component picked up by the first component-mounting device on the work;

a work position calculator for calculating the work position of the work based on data detected by the sensor; and a calculator for calculating the data indicating the operational moving pattern of the first component-mounting device based on the data indicating the to-be-mounted position of the picked-up component outputted from the database, the calculated work position of the work outputted from the work position calculator, and the carrying speed of the works outputted from the carrying controller.

4. The component mounting apparatus as claimed in claim 3, further comprising:

a camera for picking up an image of the component held by the first component-mounting device; and an image recognizing device for comparing data of the component outputted from the database with data corresponding to an imaqe picked up by the camera, wherein the controller further comprises a correction amount calculator for calculating a correction amount equal to a shift amount caused when the component is held by the first component-mounting device and found based on a result of the comparison between the data of the component and the data correspondinng to the picked-up image in the image recognizing device, whereby the calculator calculates the data indicating the operational moving pattern of the first component-mounting device based on the correction amount, the data indicating the to-be-mounted position of the picked-up component outputted from the database, the calculated work position of the work outputted from the work position calculating part, and the carrying speed of the works outputted from the carrying controller.

5. The component mounting apparatus as claimed in claim 2, further comprising a second component-mounting device which is substantially the same as the first component-mounting device.

6. The component mounting apparatus as claimed in claim 5, further compromising a second component supply section accommodating component supply units from which one component is picked up by the second component-mounting device, the first and second component supply sections being respectively arranged in a row at each side of a carrying direction of the works carried by the carrying device and symmetrically with respect to the carrying direction of the works, and the first and second component-mounting devices being disposed at an upstream side and a downstream side of the carrying direction of the works.

7. The component mounting apparatus as claimed in claim 2, further comprising a rotary table for rotating the works in the work area, the table being disposed at a position opposed to the first component supply section and having a carrying-in position where the work which has carried by the carrying device is carried in the table and a carrying-out position where the work which has rotated on the table is carried out by the carrying device, wherein the picked-up component is mounted on the work at the calculated position on the table by the first component-mounting device based on the calculated data indicating the operational moving pattern of the first component-mounting device under control of the controller.

8. The component mounting apparatus as claimed in claim 7, further comprising a second component-mounting device which is substantially the same as the first component-mounting device.

9. The component mounting apparatus as claimed in claim 1, wherein said carrying device moves said works in only one direction.

10. A component mounting method for mounting components on to-be-mounted positions of works being successively carried into a work area by a carrying device, comprising the steps of:

picking up one component, using a first component-mounting device, from component supply units in a first component supply section;

calculating, using a controller, a mounting position in the work area where the picked-up component is mounted on the work based on data indicating a to-be-mounted position on the work of the component picked up by the first component-mounting device, a work position of the work being successively carried, and a work-carrying speed of the carrying device, and then calculating an operational moving pattern of the first component-mounting device based on the calculated mounting position in the work area;

driving the first component-mounting device by the operational moving pattern under control of the controller; and mounting the picked-up component on the to-be-mounted position of one of the works being successively carried at the calculated mounting position by the first component-mounting device under control of the controller, the component being mounted on that work while it is being carried.

11. The component mounting method as claimed in claim 10, further comprising a step of detecting the work being successively carried and calculating the work position of the work based on the detection.

12. A component mounting method for mounting components on to-be-mounted positions of works, comprising steps of:

continuously and successively carrying the works into a work area with a carrying device in a continuous movement;

picking up one component, using a first component-mounting device, from component supply units in a first component supply section; and mounting the picked-up component on the to-be-mounted position of one of the works being successively carried into the work area while said one of the works is being continuously carried without stopping the continuous movement of the carrying device.

13. The component mounting method as claimed in claim 12, further comprising the steps of:

picking up an image of the component held by the first component-mounting device using a camera; and comparing data of the component outputted from the database with data corresponding to the image picked up by the camera using an image recognizer; and calculating a correction amount equal to a shift amount caused when the component is held by the first component-mounting device and found based on a result of the comparison between the data of the component and the data corresponding to the picked-up image, so that the calculation of the data indicating an operational moving pattern of the first component-mounting device is corrected based on the correction amount.

14. The component mounting method as claimed in claim 12, wherein the works are carried in only one direction in the work area.

* * * * *